United States Patent [19]

Nakayama et al.

[11] Patent Number: 5,600,599

[45] Date of Patent: Feb. 4, 1997

[54] DATA SIGNAL OUTPUT CIRCUIT AND SEMICONDUCTOR MEMORY DEVICE INCLUDING THE SAME

[75] Inventors: Tomohiro Nakayama; Yutaka Fukutani; Takanori Shiga; Masakazu Kimura, all of Kawasaki, Japan

[73] Assignee: Fujitsu Limited, Kawasaki, Japan

[21] Appl. No.: 359,462

[22] Filed: Dec. 20, 1994

[30] Foreign Application Priority Data

Jan. 26, 1994 [JP] Japan .................................. 6-007005

[51] Int. Cl.$^6$ .................................................. G11C 7/00
[52] U.S. Cl. ........................ 365/189.05; 365/189.01; 365/189.07
[58] Field of Search ................... 365/189.05, 189.01, 365/189.07, 190

[56] References Cited

U.S. PATENT DOCUMENTS

| | | | |
|---|---|---|---|
| 5,311,471 | 5/1994 | Matsumoto et al. | 365/189.05 |
| 5,329,506 | 8/1993 | Dachtera et al. | 365/189.05 |
| 5,384,736 | 1/1995 | Jung et al. | 365/189.05 |

Primary Examiner—Tan T. Nguyen
Attorney, Agent, or Firm—Armstrong, Westerman, Hattori, McLeland & Naughton

[57] ABSTRACT

An object of the present invention is to improve the output speed of a data signal output circuit having a latch circuit when the supply voltage is low. The data signal output circuit according to the present invention includes a latch circuit; an output circuit; a latch control circuit; an output control circuit; and a supply voltage decrease detection circuit. The latch circuit latches and holds a data signal according to a latch signal output from the latch control circuit. By setting the latch signal to one of two logical states, the latch circuit changes to a through state directly outputting an input data signal. The output circuit changes between a state for outputting a data signal from the latch circuit and a high-impedance state according to an output control signal output from the output control circuit. The supply voltage decrease detection circuit detects whether or not the supply voltage is less than a pre-determined value. When the supply voltage decrease detection circuit detects that the supply voltage is less than the pre-determined value the latch control circuit outputs a latch signal to set the latch circuit to the through state and the output control circuit outputs an output control signal to set the output circuit to output the data signal from the latch circuit.

6 Claims, 6 Drawing Sheets

Fig. 1
PRIOR ART
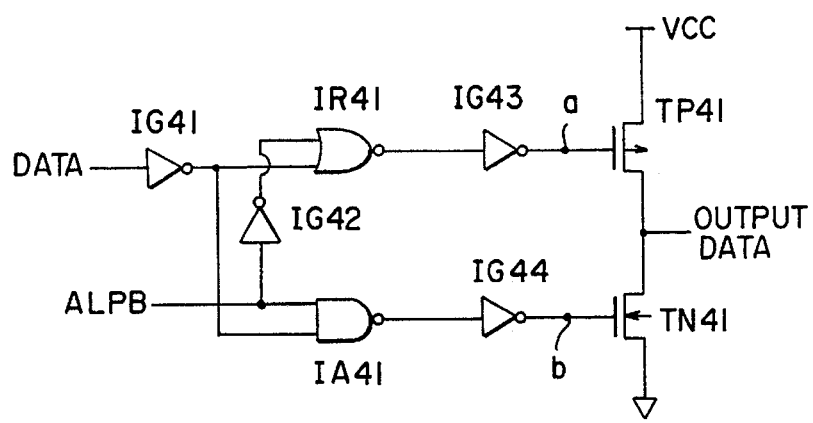
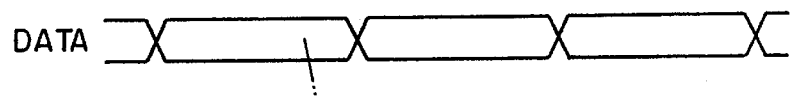
Fig. 2A
PRIOR ART
Fig. 2B
PRIOR ART
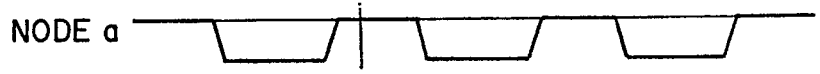
Fig. 2C
PRIOR ART
Fig. 2D
PRIOR ART
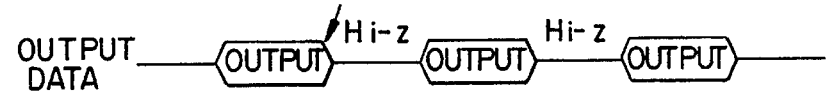
Fig. 2E
PRIOR ART Fig. 4A PRIOR ART  VCC Fig. 4B PRIOR ART  0V Fig. 4C PRIOR ART  ADDRESS Fig. 4D PRIOR ART  DATA Fig. 4E PRIOR ART  CLK Fig. 4F PRIOR ART  LATCH CIRCUIT (SOUT)

Fig. 4G PRIOR ART  ALPB

Fig. 4H PRIOR ART  OUTPUT DATA

WHEN THE SUPPLY VOLTAGE IS NORMAL → WHEN THE SUPPLY VOLTAGE IS LOW

DATA SIGNAL OUTPUT CIRCUIT AND SEMICONDUCTOR MEMORY DEVICE INCLUDING THE SAME

BACKGROUND OF THE INVENTION

1. Field of the Invention

The present invention relates to a data signal output circuit which is used in a data signal output portion of a semiconductor memory device, etc., and a semiconductor memory device including a such data signal output circuit. Particularly, the present invention relates to an improvement in the output speed of the data signal output circuit when the supply voltage is low.

2. Description of the Related Art

In a semiconductor memory device, a sense amplifier reads out data stored in each memory cell, and the sense amplifier outputs the read data to extened circuits via a data signal output circuit. In order to increase the operation speed, there is proposed a semiconductor memory device in which operations are performed in synchronous with a clock signal. This type semiconductor memory device is further divided into two types. One is a synchronous type device in which the clock signal is input from outside, and the other is an asynchronous type device in which the clock signal is generated in the device. Alternatively, in this type semiconductor memory device, the data signal output circuit is also required to output a data signal in synchronous with the clock signal or with an output control signal which is synchronous with the clock signal.

In conventional data signal output circuits, a p-channel MOS transistor and an n-channel MOS transistor are serially connected between a high potential side and a low potential side of a power supply. The combination of these two transistors constitutes an inverter. An inverted data signal is applied to the gates of the p-channel MOB transistor and the n-channel MOS transistor. In order to output the data signal in synchronous with the output control signal, signals obtained by combining the output control signal with the data signal are applied to the gates of the transistors.

In the data signal output circuit, the output speed is required to be fast. Namely, the change times at the rising and the failing edges of the output data signal are desired to be as short as possible. The change times at the rising and the falling edges of the output data signal are determined by the drive abilities of the p-channel MOB transistor and the n-channel MOB transistor at the last stage, and the drive abilities of the transistors are determined by the sizes of the transistors. Therefore, the output speed are determined by the sizes of the transistors. However, when the sizes of the transistors are excessively large to reduce the times, the voltages of the power supply lines near these transistors fluctuate due to changes in the output signals of the inverter consisting of these transistors. When these voltage fluctuations are generated, it may happen that the output data signal of the sense amplifier temporarily changes and then returns to the correct state. When this phenomenon happens, it causes the data signal output speed to become slow. Therefore, because the sizes of the transistors of the last stage cannot be made to be very large, the data signal output signal cannot be very fast.

In order to improve the data signal output speed, a data signal output circuit having a latch circuit is proposed. The latch circuit is added at a stage preceeding the output circuit and the output data signal is stably held by the latch circuit when the output data signal is output from the output circuit. In this circuit, the sizes of the transistors can be made to be very large because the data signal is stably held by the latch circuit. Therefore, in this circuit, the output speed can be made to be very fast.

The latch signal which controls the latch circuit is generated from the clock signal, and the latch signal and the output control signal are complementary to each other. The duty ratios of these signals change when the supply voltage is low. Because these signals are complementary to each other, the duty ratios of the latch signal and the output control signal respectively change in different directions. For example, the conventional data signal output circuit starts to output the data signal when the latch signal changes to low and the output control signal changes to high. When the voltage of the power supply is normal, the data signal is output a certain time after the input data signal to the latch circuit changes. However, when the voltage of the power supply falls, the time during the latch signal is high and the output control signal is low also becomes longer. Therefore, the time from the change of the input data signal to the latch circuit until the data signal is output becomes longer. In this way, there occurs a problem that the data output speed decreases. Of course, when the voltage of the power supply is low, the data output speed of the sense amplifier also decreases, but the output data signal from the sense amplifier is further delayed because the duty ratios of latch signal and the output control signal change.

The latch circuit is added to the output circuit in order to increase the output speed. However, when the voltage of the power supply is low, the data signal output circuit having the latch circuit decreases the output speed. Namely, when the voltage of the power supply is low, the output speed of the output circuit having the latch circuit becomes slower than that of a circuit having no latch circuit.

SUMMARY OF THE INVENTION

The present invention relates to a data signal output circuit in which a latch circuit is added in order to improve the output speed. An object of the present invention is to improve the output speed when the supply voltage falls.

The data signal output circuit according to the present invention includes a latch circuit; an output circuit; a latch control circuit; an output control circuit; and a supply voltage decrease detection circuit. The latch circuit latches and holds a data signal according to a latch signal from the latch control circuit. By setting the latch signal to one of two logical states, the state of the latch circuit changes to a through state to directly output an input data signal. The output circuit changes its state between a state for outputting a data signal from the latch circuit and a high-impedance state according to an output control signal from the output control circuit. The supply voltage decrease detection circuit outputs a detection signal when the supply voltage is less than the pre-determined value. In response to this detection signal, the latch control circuit outputs a latch signal to set the latch circuit to the through state and the output control circuit outputs an output control signal to set the output circuit to output a data signal from the latch circuit.

In the data signal output circuit according to the present invention, when the supply voltage is normal, the latch circuit and the output circuit operate in a conventional way, therefore, the output speed can be high. When the supply voltage decrease detection circuit detects that the supply voltage is less than the pre-determined value, the latch control circuit outputs a latch signal to set the latch circuit to the through state and the output control circuit outputs an output control signal to set the output circuit to output data signal from the latch circuit. Namely, the latch circuit and the output circuit operate as through circuits, and the input data signal are directly output through these circuits. Therefore, a reduction in the output speed due to the changes in the duty ratios of the latch signal and the output control signal does not occur.

As described above, the latch circuit is added in order to avoid operation errors due to a fluctuation of the supply voltage when the drive abilities of the transistors in the last stage are large. When the latch circuit operates as the through circuit as the present invention, it is possible that operating errors may occur. However, when the supply voltage is less than the pre-determined value, a fluctuation in the supply voltage is also suppressed, therefore, the above problem does not occur.

BRIEF DESCRIPTION OF THE DRAWINGS

The present invention will be more clearly understood from the description, as set forth below, with reference to the accompanying drawings, wherein:

FIG. 1 is a circuit diagram showing a conventional data signal output circuit;

FIGS. 2A to 2E are a time chart showing operations of the data signal output circuit shown in FIG. 1;

FIGS. 4A to 4H are a time chart showing operations of the data signal output circuit shown in FIG. 3;

DESCRIPTION OF THE PREFERRED EMBODIMENTS

Before proceeding to a detailed description of the preferred embodiments of the present invention, conventional data signal output circuits will be described to give a clearer understanding of the differences between the present invention and the prior art.

FIG. 1 is a circuit diagram showing a conventional data signal output circuit of a synchronous type semiconductor memory device, and FIG. 2 is a time chart showing operations of the data signal output circuit shown in FIG. 1.

In FIG. 1, references IG41, IG42, IG43 and IG44 indicate inverter gates; IR41 indicates a NOR gate; IA41 indicates a NAND gate; TP41 indicates a p-channel MOB transistor; TN41 indicates an n-channel MOB transistor; a indicates a node connected to the gate of the TP41; and b indicates a node connected to the gate of the TN41. The p-channel MOB transistor TP41 and the n-channel MOS transistor TN41 constitute an inverter.

Figure 3:
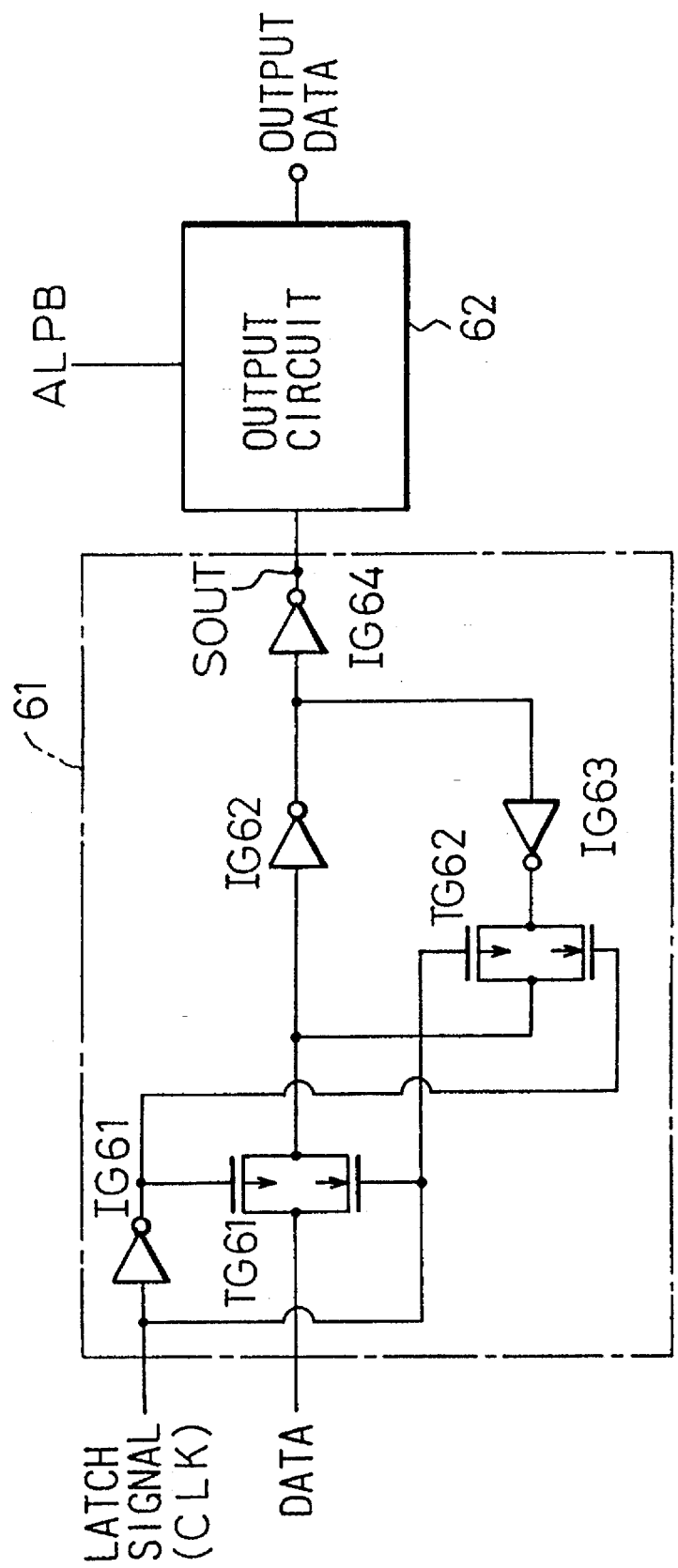
FIG. 3 is a conventional data signal output circuit to which a latch circuit is added.

In FIGS. 2 and 3, reference DATA indicates an input data signal to this circuit; OUTPUT DATA indicates an output data signal from this circuit; and ALPB indicates an output control signal. The ALPB signal is synchronous with a clock signal. The output control signal ALPB controls the data signal output operation in this circuit.

When the ALPB is high, the OR gate IR41 and the AND gate IA41 operate as inverting gates, therefore, the input data signal is inverted by the circuit IG41, IR41, and IG43 and is applied to the gate of TP41. Similarly, the input data signal is inverted through the circuit IG41, IA41, and IG44 and is applied to the gate of TN41. Therefore, potentials of nodes a and b change according to the input data signal DATA. When the input data signal DATA is high, TP41 turns on and TN41 turns off because the potentials of nodes a and b are low. Therefore, the output data signal OUTPUT DATA is high. Similarly, when the input data signal DATA is low, the potentials of nodes a and b are high, TP41 turns off, TN41 turns on, and the output data signal OUTPUT DATA is low.

When the ALPB is low, an output of IR41 is fixed to low and an output of IA41 is fixed to high regardless of the input data signal DATA and TP41 and TN41 turn off because the potential at the node a is high and the potential at the node b is low. Consequently, the output circuit changesa to a high impedance state.

As described above, in the data signal output circuit shown in FIG. 1, the output speed must be fast. Namely, the rising and falling times of the output data signal must be as short as possible. The rising and falling times of the output data signal are determined by the speeds of the p-channel MOB transistor TP41 and the n-channel MOS TN41 transistor in the last stage. Further, the speeds of the p-channel MOS transistor TP41 and the n-channel MOS transistor TN41 of the last stage are determined by drive abilities of the transistors, and the drive abilities of the transistors are determined by sizes of the transistors. Therefore, the output speed is determined by the sizes of the transistors TP41 and TN41.

However, when the sizes of the transistors are very large, to increase the output speed, the voltages of power supply lines near these transistors change due to changes in the output signals from the transistors. When these voltage changes are generated, it may happen that the output data signal of the sense amplifier temporarily changes to the opposite state and then returns to a correct state. When this phenomenon happens, the output speed becomes slow. Therefore, because the sizes of the transistors of the last stage cannot be made very large, the output data signal cannot be very fast.

In order to improve the output speed, a data signal output circuit having a latch circuit is proposed.

FIG. 3 is a circuit diagram showing a conventional data signal output circuit in which the latch circuit is added before the output circuit shown in FIG. 1. FIG. 4 is a time chart showing operations of the output circuit shown in FIG. 3 when it is used in a synchronous type semiconductor memory device.

In FIG. 3, reference 61 indicates a latch circuit; and 62 indicates a output circuit similar to that shown in FIG. 1. The latch signal is synchronous with the clock signal CLK.

In FIG. 4, operations when the supply voltage is normal are shown in the left portion, and operations when the supply voltage is low are shown in the right portion.

As shown in FIG. 4, an output of a data signal read out from each memory cell is delayed a certain time after an address signal has changed. It is assumed that the latch signal CLK and the output control signal ALPB change in synchronous with the data signal. In the latch circuit 61, when the latch signal CLK is high, a transfer gate TG61 which is composed of a p-channel transistor and an n-channel transistor conducts, the transfer gate TG62 is turned off. Therefore, when the latch circuit 61 conducts, an input data signal DATA is directly output as an output signal BOUT. When the latch signal CLK changes to low, the transfer gate TG61 turns off, the transfer gate TG62 changes to conducting, and the data signal at that time is stored in a flip-flop circuit consisting of an inverter gates IG62 and IG63. This data signal is held while the latch signal is low. The latch signal CLK and the output control signal ALPB are complementary to each other. Therefore, while the output control signal ALPB is high and the data signal is output from the output circuit 62, the clock signal CLK is low and the output of the latch circuit 61 is stably held.

When sizes of the transistors of the last stage of the output circuit 62 are increased in order to improve the operation speed, the voltages on the power supply lines near these transistors change due to changes of output signals of the transistors. However, in the circuit shown in FIG. 3, the output data signal does not change because the data signal is stably held in the latch circuit. Therefore, the sizes of the transistors of the last stage can be made very large. In this way, in the circuit shown in FIG. 3, the output speed can be made very fast.

When the data signal output circuit shown in FIG. 3 is used in a synchronous type semiconductor memory, the frequency of the latch signal CLK and the output control signal ALPB is determined so as to make the operation speed as high as possible considering the operating speeds of internal portions of the memory device. Once the frequency of the latch signal CLK and the output control signal ALPB is determined, the output speed is determined by the frequency of the latch signal CLK and the output control signal ALPB.

The latch signal CLK and the output control signal ALPB are generated from a clock signal. The voltage of the power supply influences the generation of these signals so that, as shown in FIG. 4, the duty ratios of the latch signal CLK and the output control signal ALPB change in different directions. In the data signal output circuit shown in FIG. 3, the output of the data signal starts when the latch signal CLK changes to low and the output control signal ALPB changes to high. When the voltage of the power supply is normal, the data signal is output after time d1 from when the input data signal to the latch circuit 61 changes. However, when the voltage of the power supply falls, the duration in which the latch signal CLK is high and the output control signal ALPB is low becomes long. Therefore, time d2 from when the input data signal to the latch circuit 61 changes until when the data signal is output becomes longer than the time d1. In this way, there occurs a problem that the output speed decreases by the difference between d2 and d1. Of course, when the voltage of the power supply is low, the output speed from the sense amplifier also decreases, but the data signal output from the sense amplifier is further delayed according to the latch signal CLK and the output control signal ALPB in the circuit shown in FIG. 3.

The latch circuit is added to the output circuit in order to increase the output speed. However, when the voltage of the power supply is low, the latch circuit conversely decreases the output speed. Namely, when the voltage of the power supply is low, the data signal output speed of the circuit shown in FIG. 3 becomes less than that of the circuit shown in FIG. 1.

Figure 5:
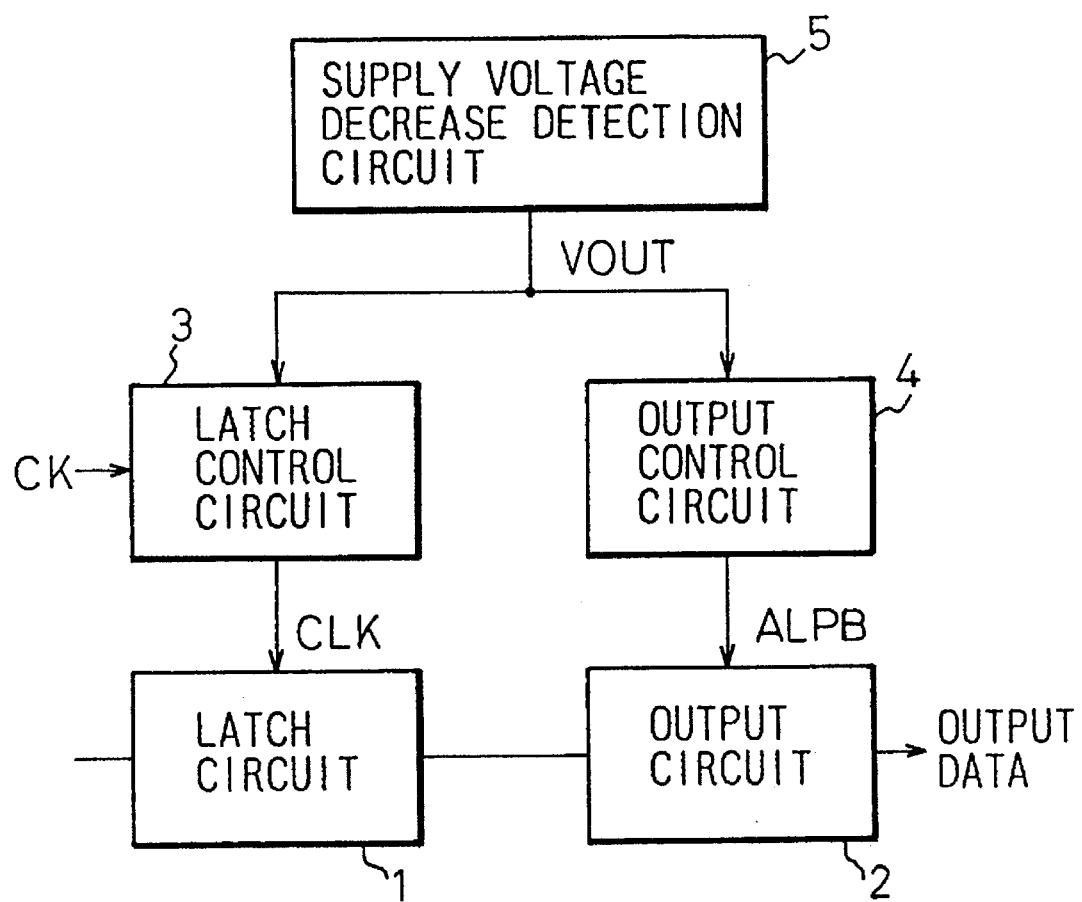
FIG. 5 is a block diagram showing a fundamental constitution of a data signal output circuit according to the present invention.

FIG. 5 is a diagram showing a fundamental constitution of a data signal output circuit according to the present invention.

As shown in FIG. 5, the data signal output circuit according to the present invention includes a latch circuit 1; an output circuit 2; a latch control circuit 3; and an output control circuit 4. The latch circuit 1 latches and holds a data signal according to a latch signal CLK from the latch control circuit 3 and changes to a through state by setting the latch signal CLK to one of two logical states. In the through state, the latch circuit 1 directly outputs the input data signal. The output circuit changes between a state for outputting a data signal from the latch circuit and a high-impedance state according to the output control signal ALPB from the output control circuit 4. The data signal output circuit according to the present invention further includes a supply voltage decrease detection circuit 5 which detects that a supply voltage is below a pre-determined value. When the supply voltage decrease detection circuit 5 detects that the supply voltage is below the pre-determined value, the latch control circuit 3 outputs a latch signal CLK to set the latch circuit 1 to the through state and the output control circuit 4 outputs an output control signal ALPB to set the output circuit 2 to output data signal from the latch circuit 1.

Figure 6:
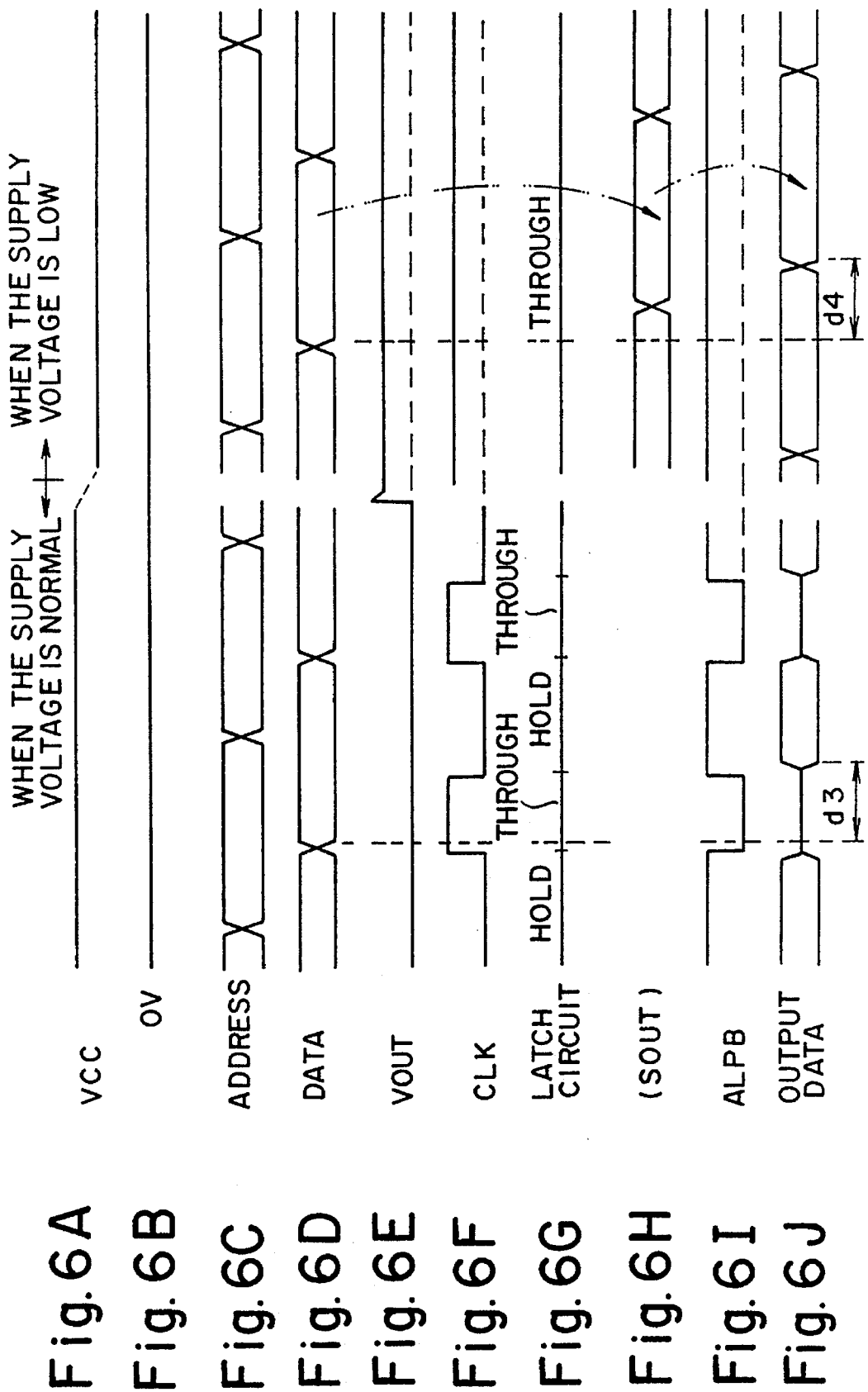
FIGS. 6A to 6J are a time chart showing operations of the data signal output circuit according to the present invention.

FIG. 6 is a time chart showing the operation of the data signal output circuit according to the present invention. Operations when the supply voltage is normal are shown in the left portion, and operations when the supply voltage has fallen are shown in the right portion.

As shown in FIG. 6, in the data signal output circuit according to the present invention, when the supply voltage is normal, the latch circuit 1 and the output circuit 2 operate in a conventional way and the output speed can be made very high. When the supply voltage decrease detection circuit detects that the supply voltage is less than the pre-determined value, the latch control circuit 3 outputs a latch signal CLK to set the latch circuit 1 to the through state and the output control circuit 4 outputs an output control signal ALPB to set the output circuit 2 to output the data signal from the latch circuit 1. Namely, the latch circuit 1 and the output circuit 2 respectively operate as through circuits, and the input data signal is directly output through these circuits. Therefore, a reduction in the output speed due to changes in the duty ratios of the latch signal CLK and the output control signal ALPB does not occur.

As described above, the latch circuit 1 is added in order to avoid operation errors due to a fluctuation in the supply voltage when the drive abilities of the transistors of the last stage is large. When the latch circuit operates as the through circuit in the present invention, it is feared that operation errors may occur. However, when the supply voltage is less than the pre-determined value, the fluctuation of the supply voltage is also suppressed, therefore, the above problem does not occur.

Figure 7:
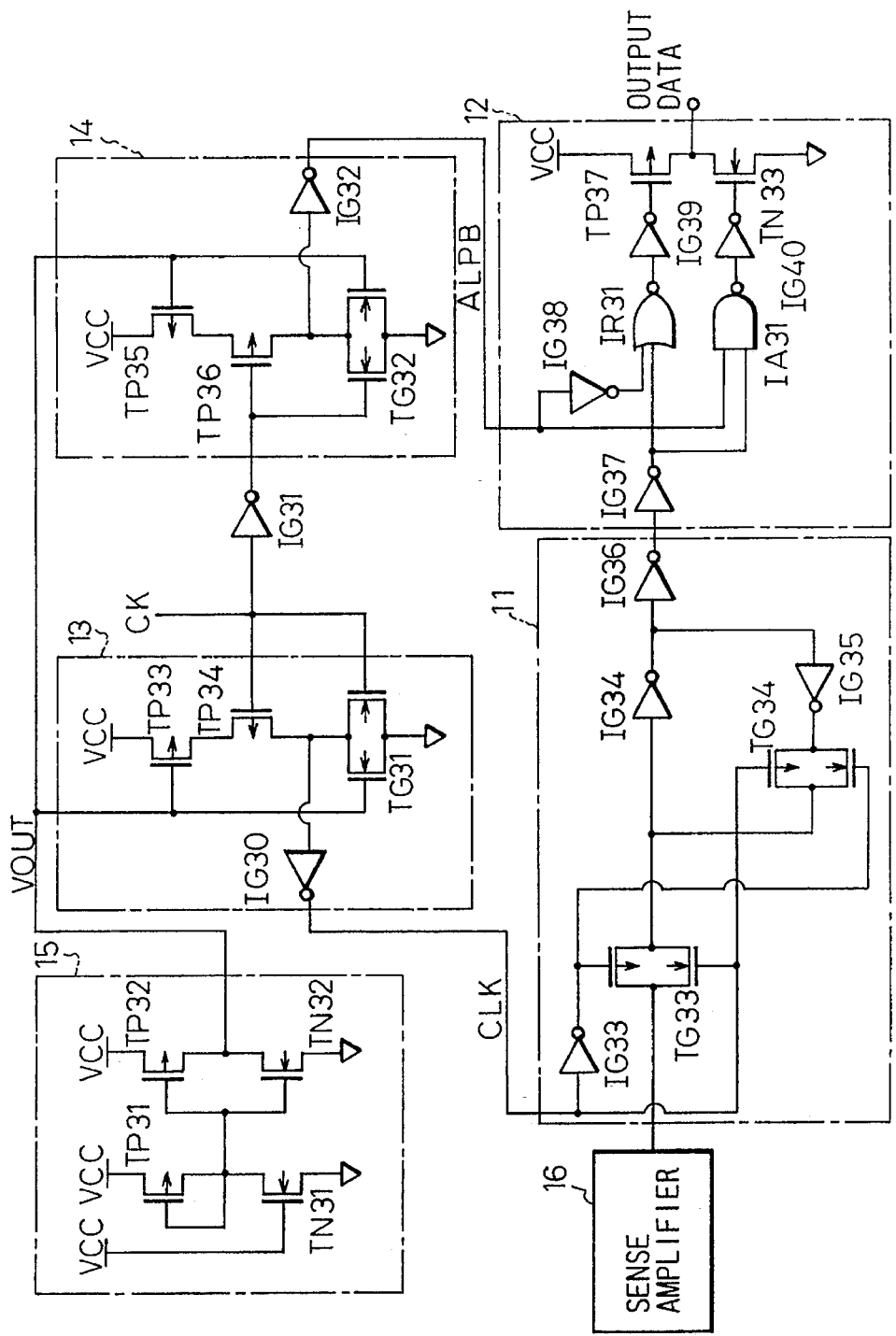
FIG. 7 is a circuit diagram of an embodiment in which the present invention is applied to a data signal output circuit of a semiconductor memory device.

FIG. 7 is a circuit diagram of an embodiment in which the present invention is applied to a data signal output circuit of a semiconductor memory device. In FIG. 7, only a sense amplifier and an output portion of the semiconductor memory device are shown. The operations of this circuit are similar to those shown in FIG. 6, therefore, the operations of this circuit will be explained with reference to FIG. 6.

In FIG. 7, reference 11 indicates a latch circuit similar to the circuit shown in FIG. 3; 12 indicates an output circuit similar to the circuit shown in FIG. 1; 13 and 14 are respectively a latch control circuit and an output control circuit which have similar constitutions except that input clock signals are complimentary; 15 indicates a supply voltage decrease detection circuit which detects whether or not the supply voltage is less than a pre-determined value;

and 16 indicates a sense amplifier. The supply voltage decrease detection circuit 15 outputs a detection signal VOUT. The detection signal VOUT is low when the supply voltage is normal and is high when the supply voltage falls. The sense amplifier 16 can have a constitution similar to any conventional amplifier used in semiconductor memory devices, therefore, a detailed constitution of the sense amplifier is omitted.

A signal CK and the detection signal VOUT are output to the latch control circuit 13. The signal CK is generated from a clock signal and has a frequency the same as the clock signal. The detection signal VOUT is low when the supply voltage is normal. When the detection signal VOUT is low, a transistor TP33 conducts, and a comibination gate TG31 which is composed of two n-channel transistors operates as an n-channel transistor with regard to the signal CK. Therefore, the p-channel transistor TP34 and the combination gate TG31 operate as an inverter gate to which the signal CK is input. An output of this inverter circuit is input to an inverter IG30, therefore, the latch control circuit 13 outputs a latch signal CLK the same as the signal CK. As described with reference to FIG. 3, the latch circuit 11 is in a through state when the latch signal CLK is high, the latch circuit 11 latches a data signal output from the sense amplifier 16 when the latch signal changes to low. The latch circuit 11 holds and outputs the latched data signal during the latch signal CLK is low. When the supply voltage is less than the pre-determined value, the detection signal VOUT goes high. When the detection signal VOUT is high, the p-channel transistor TP33 does not conduct and the comination gate TG31 conducts regardless of the signal CK, therefore, an input to the inverter IG30 is low and the latch signal CLK, which is an output of the inverter IG30, is high. When the latch signal CLK is high, the transfer gate TG33 of the latch circuit 11 conducts and the transfer gate TG34 does not conduct. Therefore, the data signal output from the sense amplifier 16 passes through the inverters IG34 and IG36 and is directly input to the output circuit 12.

The output control circuit 14 has a constitution the same as that of the latch control circuit 13 except that an inverted signal derived from the signal CK is input. The inverted signal is obtained by inverting the signal CK by an inverter IG31. Therefore, when the detection signal VOUT is low, namely, the supply voltage is normal, the output control circuit 14 outputs an output control signal ALPB which is complimentary to the latch signal CK. When the detection signal VOUT is high, namely, the supply voltage is low, the output control signal ALPB is high. As described with reference to FIGS. 1 and 2, the output circuit 12 is in a high-impedance when the output control signal ALPB is low, and the output circuit 12 directly outputs the input signal when the output control signal ALPB is high.

As shown in FIG. 6, the data signal output circuit shown in FIG. 7 outputs a data signal when the output control signal ALPB is high. When the output control signal ALPB is high, the latch signal CLK is low, and the latch circuit 11 holds a data signal latched at the instant when the latch signal CLK changes to low. Therefore, although the last stage of the output circuit 12 is composed of transistors having large drive capabilities, a fluctuation in the data signal input to the output circuit 12 does not occur because the data signal is stably held in the latch circuit 11. When the supply voltage is low, the latch circuit 11 and the output circuit 12 pass and output the input data signal. In this way, the data signal output from the sense amplifier 16 passes through the latch circuit 11 and the output circuit 12. In practice, a certain time is required to pass through the latch circuit 11 and the output circuit 12, therefore, the data signal is output from the output circuit 12 after a delay from when the data signal is output from the sense amplifier 16. In FIG. 6, this delay is represented by d4. The delay d2 shown in FIG. 4 is determined by the time instant when the output control signal ALPB changes to high, however, the delay d4 is not influenced by the output control signal ALPB. When conditions of the circuit are practically determined, the pre-determined value of the supply voltage decrease detection circuit and so forth are determined by taking into consideration a delay from when the supply voltage decreases below the pre-determined value until the output control signal ALPB changes to high, the delay d4, and a decrease in the influence of noise due to the decrease in the supply voltage.

As described above, when the present invention is applied to a data signal output circuit having a latch circuit, which is used in a semiconductor memory device, a decrease in the output speed due to a decrease in the supply voltage can be reduced.

We claim:

1. A data signal output circuit comprising:

a latch circuit which latches and holds a data signal according to a latch signal, said latch circuit changing to a through state directly outputting an input data signal when said latch signal is set to one of two logical states;

an output circuit which changes between a state for outputting a data signal from said latch circuit and a high-impedance state according to an output control signal;

a latch control circuit for generating said latch signal;

a output control circuit for generating said output control signal; and a supply voltage decrease detection circuit for detecting a decrease in a supply voltage, and when said supply voltage decrease detection circuit detects a decrease in said supply voltage, said latch control circuit outputs a latch signal to set said latch circuit to said through state and said output control circuit outputs an output control signal to set said output circuit to output the data signal from said latch circuit.

2. A data signal output circuit as set forth in claim 1, wherein said latch signal and said output control signal are complementary each other.

3. A data signal output circuit as set forth in claim 1, wherein said latch circuit includes a transfer gate which changes to a conducting state according to said latch signal.

4. A semiconductor memory device comprising a data signal output circuit, said signal output circuit including:

a latch circuit which latches and holds a data signal according to a latch signal, said latch circuit changing to a through state directly outputting an input data signal when said latch signal is set to one of two logical states;

an output circuit which changes between a state for outputting a data signal from said latch circuit and a high-impedance state according to an output control signal;

a latch control circuit for generating said latch signal;

a output control circuit for generating said output control signal; and a supply voltage decrease detection circuit for detecting decrease of a supply voltage, and when said supply voltage decrease detection circuit detects decrease of said supply voltage, said latch control circuit outputs a latch signal to set said latch circuit to said through state and said output control circuit outputs an output control signal to set said output circuit to output the data signal from said latch circuit.

5. A semiconductor memory device as set forth in claim 4, wherein said latch signal and said output control signal are complementary each other.

6. A semiconductor memory device as set forth in claim 4, wherein said latch circuit includes a transfer gate which changes to a conducting state according to said latch signal.

* * * * *